(12) United States Patent
Kim et al.

(10) Patent No.: US 8,717,118 B2
(45) Date of Patent: May 6, 2014

(54) TRANSFORMER SIGNAL COUPLING FOR FLIP-CHIP INTEGRATION

(71) Applicant: QUALCOMM Incorporated, San Diego, CA (US)

(72) Inventors: Jonghae Kim, San Diego, CA (US); Feng Wang, San Diego, CA (US); Matthew M. Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/705,655

(22) Filed: Dec. 5, 2012

(65) Prior Publication Data

US 2013/0095576 A1    Apr. 18, 2013

Related U.S. Application Data

(63) Continuation of application No. 12/547,988, filed on Aug. 26, 2009, now Pat. No. 8,350,639.

(51) Int. Cl.
*H03H 7/38* (2006.01)
(52) U.S. Cl.
USPC .......................................................... 333/33
(58) Field of Classification Search
USPC .......................................... 333/33, 32, 25, 26
See application file for complete search history.

(56) References Cited

U.S. PATENT DOCUMENTS

| | | | |
|---|---|---|---|
| 5,519,582 | A | 5/1996 | Matsuzaki |
| 6,081,030 | A | 6/2000 | Jaouen et al. |
| 2006/0022336 | A1 | 2/2006 | Franzon et al. |
| 2006/0148106 | A1 | 7/2006 | Ding et al. |
| 2006/0276155 | A1 | 12/2006 | Feldtkeller |
| 2011/0050357 | A1 | 3/2011 | Kim |

FOREIGN PATENT DOCUMENTS

| | | |
|---|---|---|
| EP | 2071625 | 6/2009 |
| WO | 0104956 | 1/2001 |

OTHER PUBLICATIONS

International Search Report and Written Opinion—PCT/US2010/046862, International Search Authority—European Patent Office—Nov. 17, 2010.

*Primary Examiner* — Stephen Jones
(74) *Attorney, Agent, or Firm* — Sam Talpalatsky; Nicholas J. Pauley; Joseph Agusta

(57) ABSTRACT

Methods for transformer signal coupling and impedance matching for flip-chip circuit assemblies are presented. In one embodiment, a method for providing an inductive coupling between dies may include fabricating a first inductor on a first die using a passive process, fabricating a second inductor on a second die using a semiconductor process, and assembling each die so the first and second inductor are configured as a transformer. In another embodiment, a method for matching impedance in an RF circuit fabricated using flip-chip techniques may include passing an RF input signal through a first inductor formed using a passive process, inducing a time varying magnetic flux in proximity to a second inductor formed using an active process, and passing an RF signal induced by the time varying magnetic flux through the second inductor.

8 Claims, 7 Drawing Sheets

Fabrication Models    Circuit Models

TRANSFORMER SIGNAL COUPLING FOR FLIP-CHIP INTEGRATION

CROSS-REFERENCE TO RELATED APPLICATIONS

The present application is a continuation of U.S. patent application Ser. No. 12/547,988, entitled "TRANSFORMER SIGNAL COUPLING FOR FLIP-CHIP INTEGRATION," filed Aug. 26, 2009, the contents of which are hereby incorporated by reference in their entirety.

FIELD OF DISCLOSURE

Disclosed embodiments are generally directed to devices and methods for coupling circuits on separate integrated circuit dies. More particularly, embodiments are related to inductively coupling RF circuits for flip chip assemblies.

BACKGROUND

Modern integrated circuits may commonly utilize a combination of both active circuit elements and passive circuit elements to realize circuit designs. For example, FIG. 1 depicts a conventional RF low noise amplifier 100, which may include, for example, passive components such as capacitors 105, 115 and 125 and inductors 107, 117 and 127, and active components such as transistors 112 and 122. The RF low noise amplifier 100 may be formed on a die 102 which can be fabricated using any semiconductor fabrication technique, such as, for example, a Complimentary Metallic Oxide Semiconductor (CMOS) process. Connections with the die 102 may be formed using a wire bond pad for providing signals into and out of the circuit 100. For example pad 120 can provide the RF input signal, pad 130 can provide a supply voltage VDD, pads 140 and 150 can provide ground paths for transistors 112 and 122 respectively, and pad 160 can provide the amplified RF output signal.

Most of the surface area on the die 102 is typically consumed by the passive components. The large consumption of area by passive components is due in part to the large number of passive components included in the circuit, and also due to the fact that passive components can utilize much more surface area than active components. For example, one of the largest components on die 102 is the inductor 107 which may be used for impedance matching. The dimensions of inductor 107 may be approximately 300 μm×300 μm. The dimensions of transistor 112 may only be approximately 0.25 μm×0.25 μm. The inductor 107 therefore may consume well over a million times more area than the transistor 112. Given the high cost of manufacturing using the semiconductor process, having passive components consuming so much die space may be uneconomical. Moreover, because the capability of a circuit typically increases with transistor count, having the passive components taking up the die space which could be more effectively used by a large number of transistors can reduce the desirability of the integrated circuit 100.

One conventional approach to more efficiently utilize semiconductor die space is to fabricate the circuit with multiple dies using three-dimensional flip chip techniques. As shown in FIG. 2A, a low noise RF amplifier 200 may be realized using an active die 204, which may include transistors 112, and 122 formed thereon, and a passive die 202, which may include the inductors 107, 117 and 127, and capacitors 105, 115 and 125. The signal connection between the active die 204 and the passive die 202 may be mechanically formed through contact pads, such as pad 210a and pad 210b. During assembly, the active die 204 shown in FIG. 2A is rotated 290 (i.e., "flipped") by 180 degrees, and placed on the passive die 202 as shown in FIG. 2B. The joined passive and active dies may be bonded to packaging 206, and electrical connections between the packaging 206 and the passive die 202 may be mechanically realized using wire bonding (e.g., 220 for the RF signal input and 230 for the supply voltage VDD).

As shown in FIG. 2C, the electrical connections for the flip chip integration made between active die 204 and passive die 202 are conventionally performed mechanically using bonded micro bumps 210 at the appropriate contacts pads (e.g., 210a and 210b) on each die. Given the nature of these mechanical contacts, they can introduce additional impedance in the form of additional resistance and capacitance (also referred to herein as parasitic impedance). For many of the components in the RF amplifier 200, this parasitic impedance is not significant. For example, inductors 117 and 127 may be used as filter chokes in the circuit carrying current associated with VDD. Because the low level RF input signal does directly not pass through these components, the RF amplifier is less sensitive to variations in their impedance values. Accordingly, any parasitic impedance introduced by the bonded micro bump contacts associated with inductors 117 and 127 will not typically affect the performance of the RF low noise amplifier 200. However, inductor 107 performs impedance matching for the RF amplifier 200, and because it may be in the direct path of the low level RF input signal, factors affecting the impedance of inductor 107 may adversely affect the performance of the RF amplifier. Such factors will include the parasitic impedance introduced by the bonded micro bump connections associated with the impedance matching inductor 107.

Accordingly, there is a need for coupling techniques used in three dimensional flip chip assemblies which do not introduce parasitic impedances that may affect the performance of integrated circuits.

SUMMARY

The disclosed embodiments of the disclosure are directed to methods and apparatuses for transformer signal coupling associated with flip-chip circuit assemblies.

In one embodiment, a method for providing an inductive coupling between dies may include fabricating a first inductor on a first die using a passive process. The method may further include fabricating a second inductor on a second die using a semiconductor process and assembling each die so the first and second inductor are configured as a transformer. In one embodiment, the method may further include placing a ferromagnetic material between the first and second inductor, wherein the ferromagnetic material may comprise a ferrite film. In one embodiment, a low noise RF amplifier may be physically coupled to the second inductor, which may receive an inductively coupled RF signal that does not contact a mechanical connection from the first inductor, wherein the first inductor and second inductor may be part of an RF impedance matching circuit for the low noise RF amplifier.

In another embodiment, a method for matching impedance in an RF circuit fabricated using flip-chip techniques may include passing an RF input signal through a first inductor formed using a passive process. The method may further include inducing a time varying magnetic flux in proximity to a second inductor formed using an active process and passing an RF signal induced by the time varying magnetic flux through the second inductor. In one embodiment, the method may further include placing a ferromagnetic material between the first and second inductor, wherein the ferromagnetic material may comprise a ferrite film. In one embodiment, a low noise RF amplifier may be physically coupled to the second inductor, which may receive the induced RF signal, wherein the induced RF signal may not contact a mechanical connection and the first inductor and second inductor may be part of an RF impedance matching circuit for the low noise RF amplifier.

In another embodiment, a method for providing an inductive coupling between dies may include a step for fabricating a first inductor on a first die using a passive process, a step for fabricating a second inductor on a second die using a semiconductor process, and a step for assembling each die so the first and second inductor are configured as a transformer. In one embodiment, the method may further include a step for placing a ferromagnetic material between the first and second inductor, wherein the ferromagnetic material may comprise a ferrite film. In one embodiment, a low noise RF amplifier may be physically coupled to the second inductor, which may receive an inductively coupled RF signal that does not contact a mechanical connection from the first inductor, wherein the first inductor and second inductor may be part of an RF impedance matching circuit for the low noise R amplifier.

In another embodiment, a method for matching impedance in an RF circuit fabricated using flip-chip techniques may include a step for passing an RF input signal through a first inductor formed using a passive process, a step for inducing a time varying magnetic flux in proximity to a second inductor formed using an active process, and a step for passing an RF signal induced by the time varying magnetic flux through the second inductor. In one embodiment, the method may further include a step for placing a ferromagnetic material between the first and second inductor, wherein the ferromagnetic material may comprise a ferrite film. In one embodiment, a low noise RF amplifier may be physically coupled to the second inductor, which may receive the induced RF signal, wherein the induced RF signal may not contact a mechanical connection and the first inductor and second inductor may be part of an RF impedance matching circuit for the low noise RF amplifier.

BRIEF DESCRIPTION OF THE DRAWINGS

The accompanying drawings are presented to aid in the description of embodiments are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements of the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

As used herein, the term "active die" refers to any die having a substrate capable of including active components formed thereon using any known semiconductor process. The substrate for an active die may be any semiconductor, and may be, for example, silicon based. Both active and passive components formed thereon may use fabrication techniques including, for example, ion implantation, etching, chemical vapor deposition, etc. Such active components may include, for example, any Field Effect Transistor type structure (e.g., using CMOS), or Bipolar Junction Transistor.

As used herein, the term "passive die" refers to any die including a substrate not capable of having active components formed thereon, and as such may only support passive components (e.g., capacitors, inductors and/or resistors). The passive components may be formed using any Passive-On-Glass (POG) process, and/or may use the same known semiconductor processes which may be used to fabricate active components. The substrate for a passive die may be a material having high resistance, such as, for example, diamond, $SiO_2$ (glass), etc. Any passive components formed thereon may use fabrication techniques including, for example, ion implantation, etching, chemical vapor deposition, etc.

The various aspects of the invention may be embodied in a number of different forms, all of which have been contemplated to be within the scope of the claimed subject matter.

Figure 1:
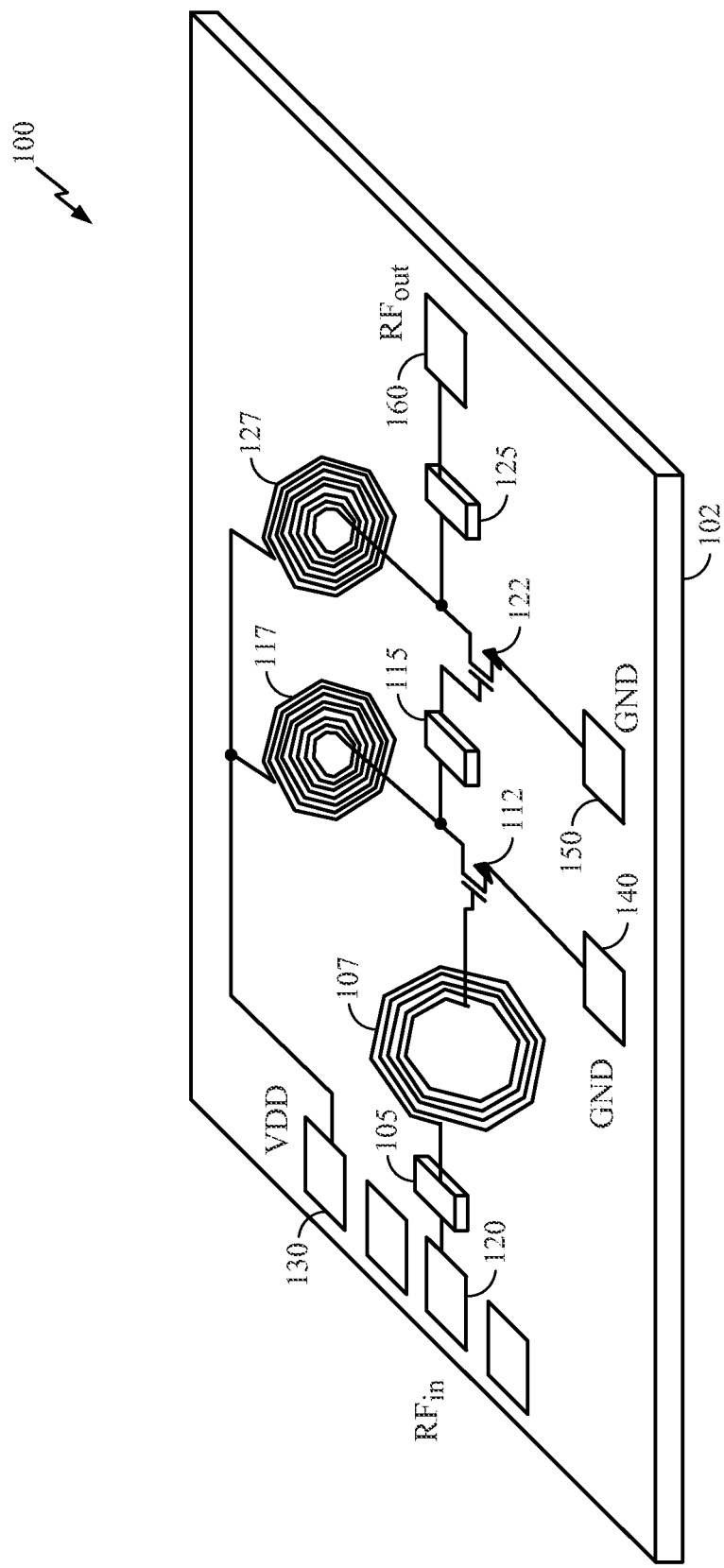
FIG. 1 is a layout diagram of a conventional integrated circuit incorporating both active and passive components.
Figure 2A:
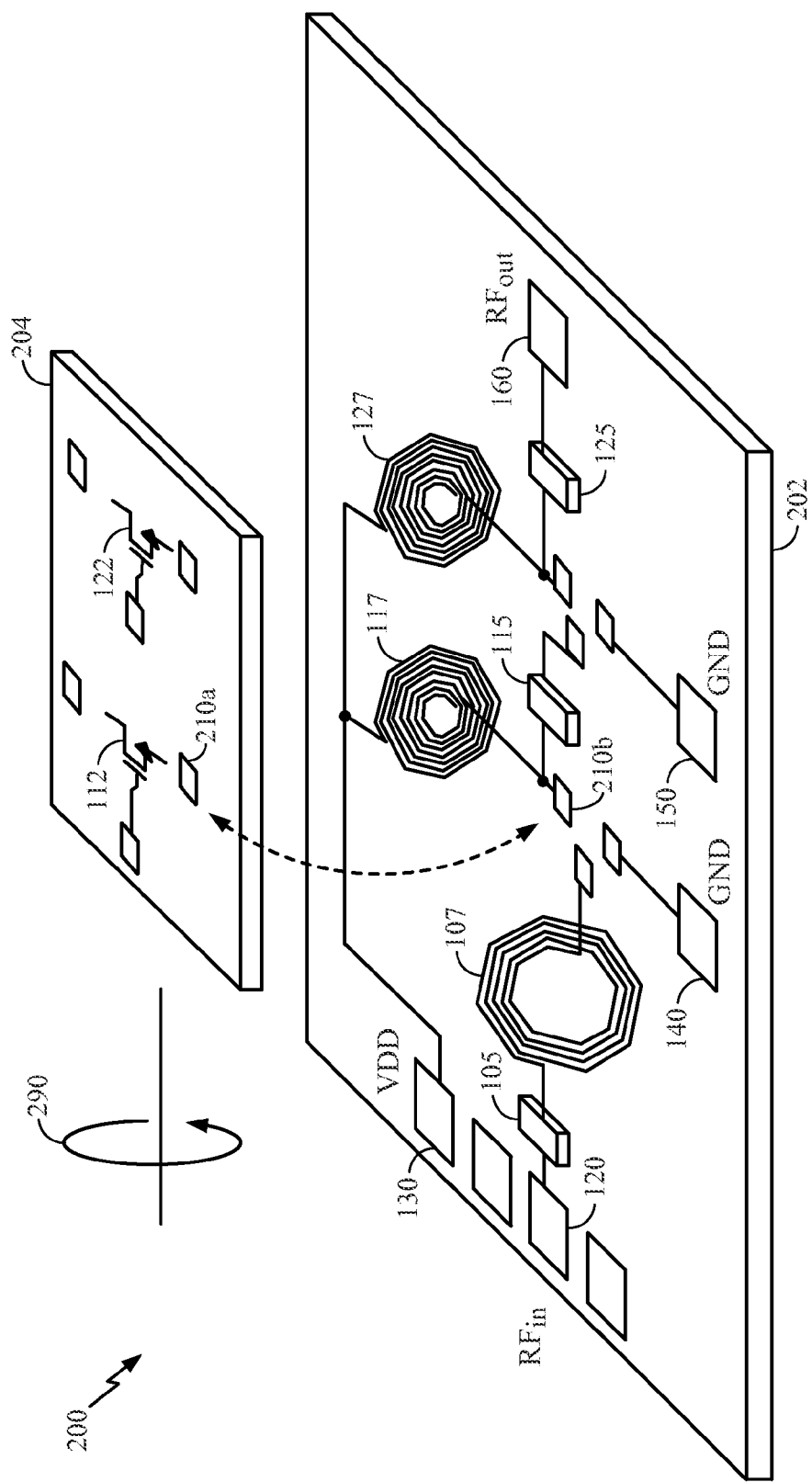
FIGS. 2A-2C are diagrams of conventional three dimensional flip chip assemblies which separate active and passive components on different dies.
Figure 2B:
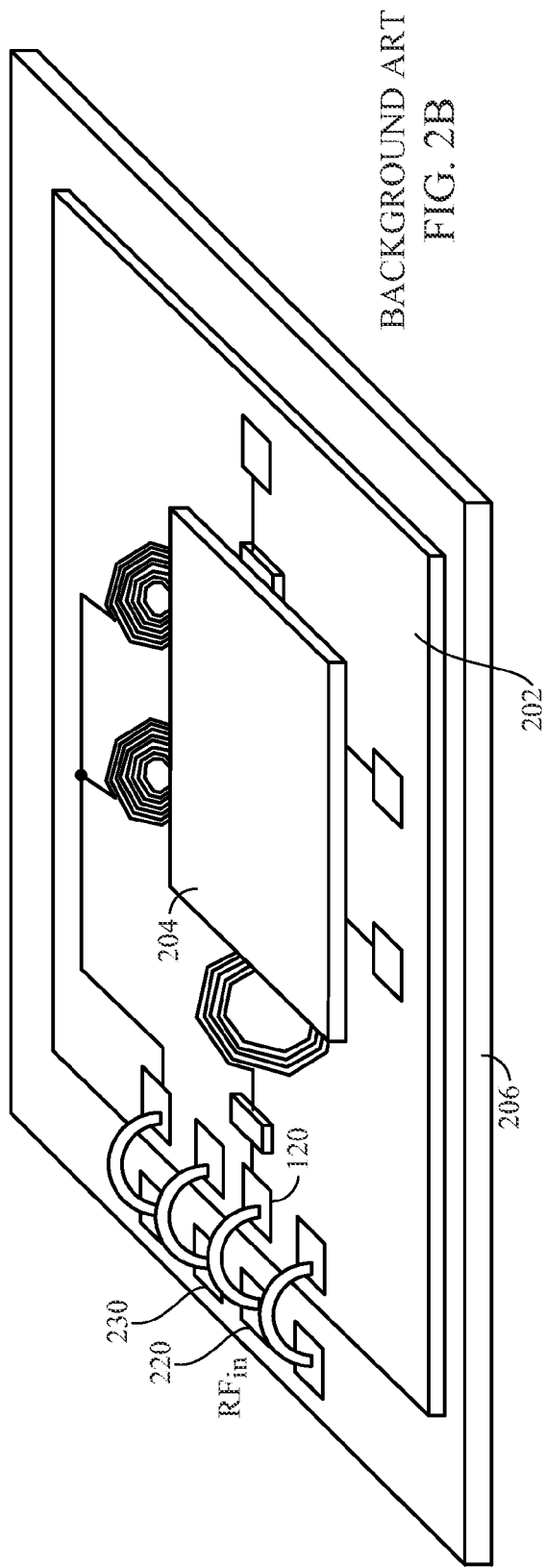
Figure 2C:
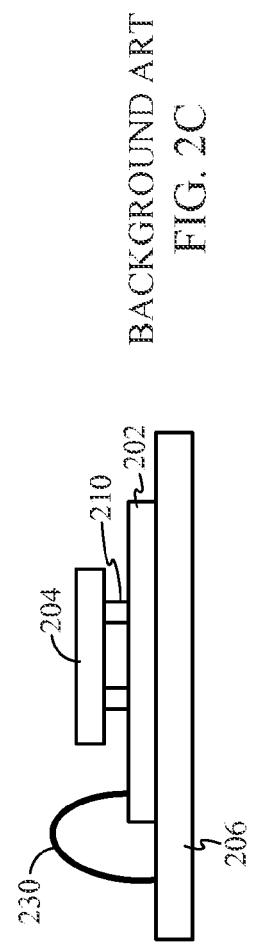
Figure 3:
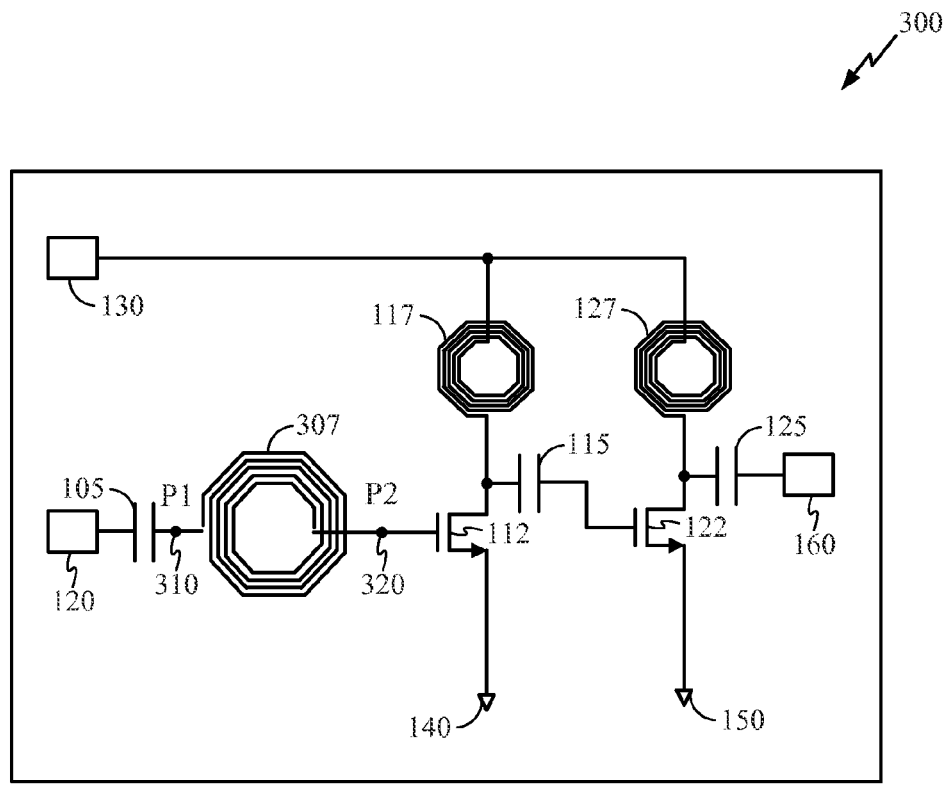
FIG. 3 is a schematic diagram of an exemplary circuit showing different inductor configurations and associated transformer models for fabrication and analysis.
Figure 3:
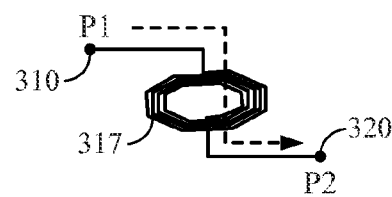
Figure 3:
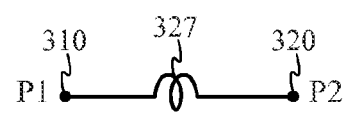
Figure 3:
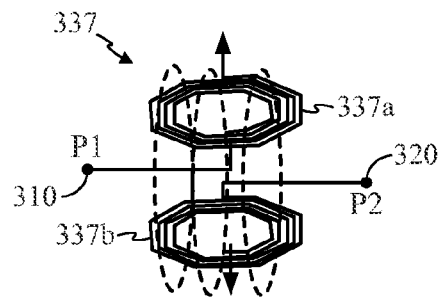
Figure 3:
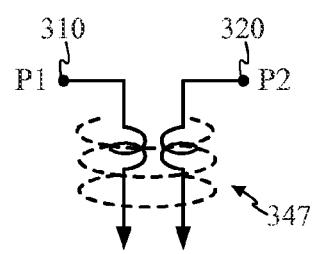

FIG. 3 is a schematic diagram of an exemplary RF amplifier 300 and component diagrams depicting different models. The RF input signal may be introduced into the RF amplifier 300 at RFin pad 120. The RF input signal passes through capacitor 105 and enters the impedance matching inductor 307 at Port 1 310. The RE input signal may then pass through the impedance matching inductor 307 and exit at Port 2 320. The signal may then be presented to the base of transistor 112 for a first stage of amplification. Because the impedance matching inductor 307 is directly in the path of the low level RF input signal, it may be quite sensitive to the overall performance of the RF amplifier 300.

The conventional impedance matching inductor may have a circuit model depicted as simple series inductor 327, where the RF input signal directly passes through Port 1 310, inductor 327, and then through Port 2 320. This series inductor may be realized as shown in the fabrication model used in flip chip integration. Here, the input signal enters P1 310 and passes directly through a set of helical windings which form inductor 317, and then pass out through Port 2 320.

In one embodiment, the impedance matching inductor 307 may be realized by two inductors which are configured as a transformer. This approach may be explained by the circuit model showing the transformer 347. The RF input signal may enter at Port 1 310 and then pass through a first inductor (also referred to herein as a primary winding) of transformer 337. The first inductor generates a time varying magnetic field in response to the excitation provided by the RF input signal. The time varying magnetic field may induce a current proportional to the RF input signal in the second inductor (also referred to herein as a secondary winding), which passes through Port 2 320. The signal between the two winding of the transformer is inductively coupled through the magnetic field, so there is no requirement for a mechanical connection to come into contact with the RF input signal.

As shown in the fabrication model of transformer 337, the inductive coupling may be realized using two helical inductors 337a and 337b acting as primary and secondary windings, respectively. The RF input signal may enter through Port 1 and pass through the primary winding helical inductor 337a, and thus produce a time varying magnetic field. The time varying magnetic field may then induce a current proportional to the RF input signal in the secondary winding 337b, and then pass through Port 2 320.

In the conventional impedance matching transformer, Port 1 310 and Port 2 320 may be fabricated using contact pads and bonded micro bumps, which are mechanical couplings that can alter the performance of the impedance matching circuit with their own parasitic impedances. However, in the configuration shown with transformer 337, no mechanical coupling need take place in order to introduce the impedance matching inductor 307 into the integrated circuit 300. The combination of the first inductor 337a and the second inductor 337b provide the inductance value for the impedance matching inductor 307, where the signal is inductively coupled between Port 1 310 and Port 2 320 without the use of a mechanical connection. Thus, the transformer coupling approach may obviate the need for using conventionally bonded micro bump connections at Port 1 310 and Port 2 320.

Figure 4:
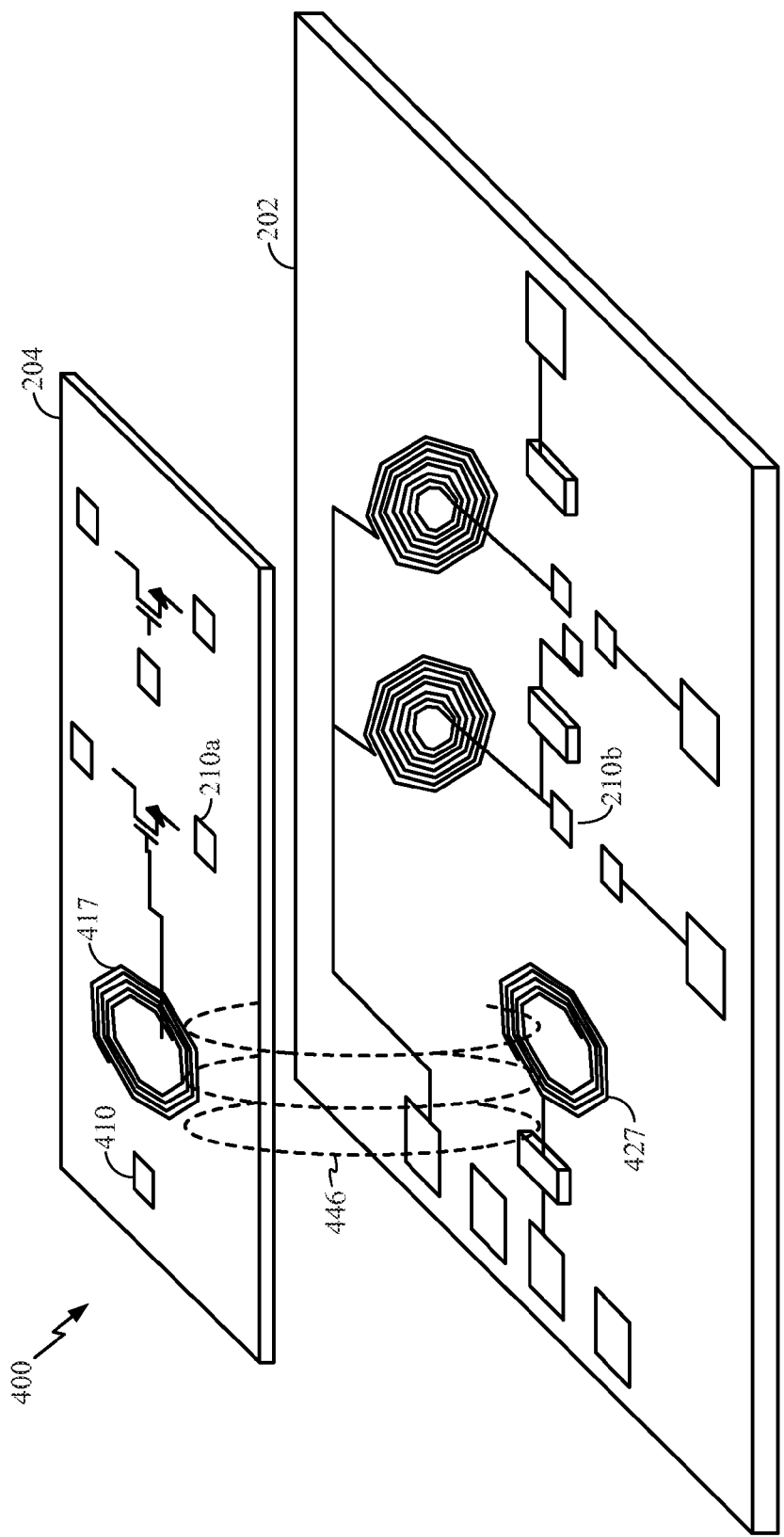
FIG. 4 is as layout diagram of an exemplary circuit using a transformer to couple a signal between two different dies.

FIG. 4 is as layout diagram of an exemplary low noise RF amplifier 400 using a transformer to couple a signal between two different dies in a three dimensional flip chip assembly. The active die 204 has an active die inductor 417 formed thereon using a semiconductor process. This process may typically be a CMOS process, but other known semiconductor fabrication processes may also be used. The active die may be primarily composed of a silicon-based material. The active die inductor 417 may be formed using a helical wire structure using a predetermined number of windings.

On the passive die 202, a passive die inductor 427 is formed, along with a number of other passive components such as capacitors, choke inductors, etc. The process for fabricating the passive components is typically less expensive that the processes used to fabricate the active die 204. The processes for fabricating the passive die 202 and the components thereon may include any Passive-On-Glass process, and/or can include processes which can be used to make active components. The components on the passive die may include resistors, capacitors, inductors, MEMS devices, antennas, transmission lines, etc. The passive die 202 may be primarily composed of glass ($SiO_2$), diamond, or any other material having high resistivity. Typically, the processes associated with fabricating the passive die are less expensive than the material used for the active die 204.

As mentioned above, the fabrication of passive components, specifically large ones such as inductors, may be expensive using a semiconductor process such as CMOS, and thus may advantageously be avoided. Accordingly, to reduce expense and improve the utilization of the surface area of the active die 204 for active components, the number of windings in the active die inductor 417 is made smaller than the number of windings in the passive die inductor 427. For example, ratio of the number of windings of the active die inductor 417 to the passive die inductor 427 may be 1:10 or more.

Once the active die 204 is "flipped" and bonded to passive die 202 using conventional techniques such as, for example, bonded micro bumps in the appropriate locations on each die, the active die inductor 417 and the passive die inductor 427 may be in such configuration/proximity so as to form a transformer. In practice, one may be motivated to configure the inductors to improve the inductive coupling within the physical and electrical constraints associated with the other components and with the joining of the dies. The inductive coupling may be improved by reducing the distance between inductors 417 and 427; however, the reduction of this distance can be constrained by mechanical reliability. Also, the horizontal alignment of the inductors with respect to each other should be considered, so that a satisfactory mutual inductance may be attained. Within the context of a transformer, the passive die inductor 427 may be considered a primary winding, and active die inductor 417 may be considered a secondary winding, both of which are inductively coupled through the time varying magnetic field 446. Accordingly, the need for the mechanical connection at the contact pads 210a, 210b to connect the active die inductor 417 to the passive die inductor 427 may be obviated.

Figure 5:
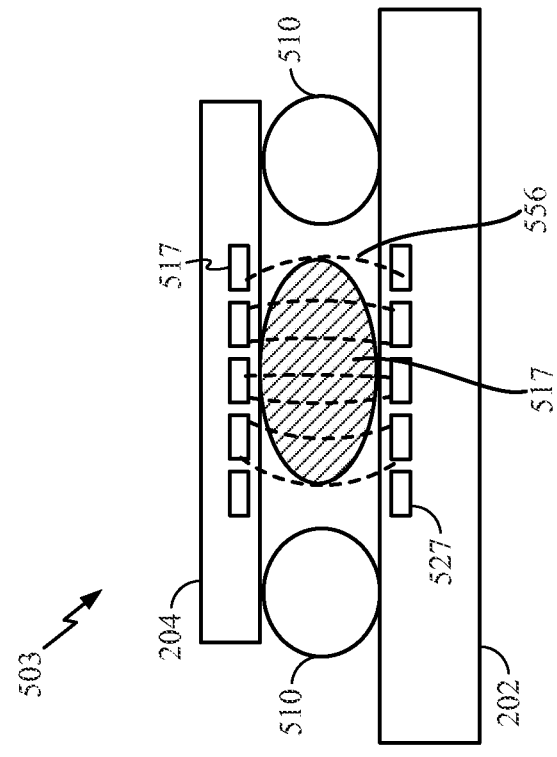
FIG. 5 is a cross section illustrating various embodiments having different transformer configurations.
Figure 5:
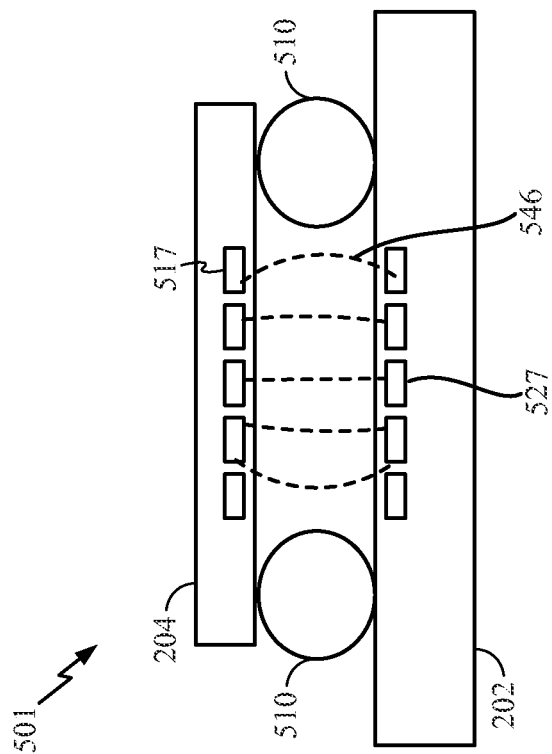

FIG. 5 is a cross section illustrating various embodiments having different transformer configurations. Transformer configuration 501 that shows a portion of the assembled flip chip package where active die 204 and passive die 202 are joined with bonded micro bumps 510. The cross sectional portions of the helical active inductor 417 are shown as traces 517 within active die 204. The cross sectional portions of the helical passive inductor 427 are shown as traces 527 in passive die 202. In 501, coupling between active and passive die inductors is accomplished through magnetic flux 546, having a given strength indicated in the drawing by the density of the field lines. The micro bumps 510 are typically not used as electrical connections for electrically coupling the active and passive die inductors in this configuration, but are used only for mechanical support. An air gap exists between the active die inductor traces 527 on active die 204, and passive die inductor (not shown) on passive die 202. This air gap may present a relatively high resistance to magnetic flux, which is known as reluctance.

In transformer configuration 503, a ferromagnetic material 517 may be placed between the active and passive die inductors, thus filling in the air gap between the metal traces 517, 527 as described above in transformer configuration 501. The ferromagnetic material may be a ferrite bead, a planar layer such as a film, and/or any other material which may reduce the magnetic reluctance between the active and passive die inductors. The reduced reluctance may increase the magnetic field 556, as indicated by the increased density of field lines. Using the ferromagnetic material in this manner can make the transformer more efficient, and may allow for the reduction of the size of the active die inductor 417. Any reduction in the size of the active die inductor 417 is desirable in order to free up valuable space on the surface active die 204, so more active devices may be formed thereon. In other embodiments, the inductor on the active die may be larger than the inductor on the passive die.

Because the inductors (i.e., the primary and secondary windings) comprising the transformer may have differing sizes, they may also have a different number of windings (depending upon the density of the spacing between the metal traces which form the inductors). For example, ratio of the number of turns of the primary winding to the secondary winding may be greater than 10:1.

Figures 6, 7:
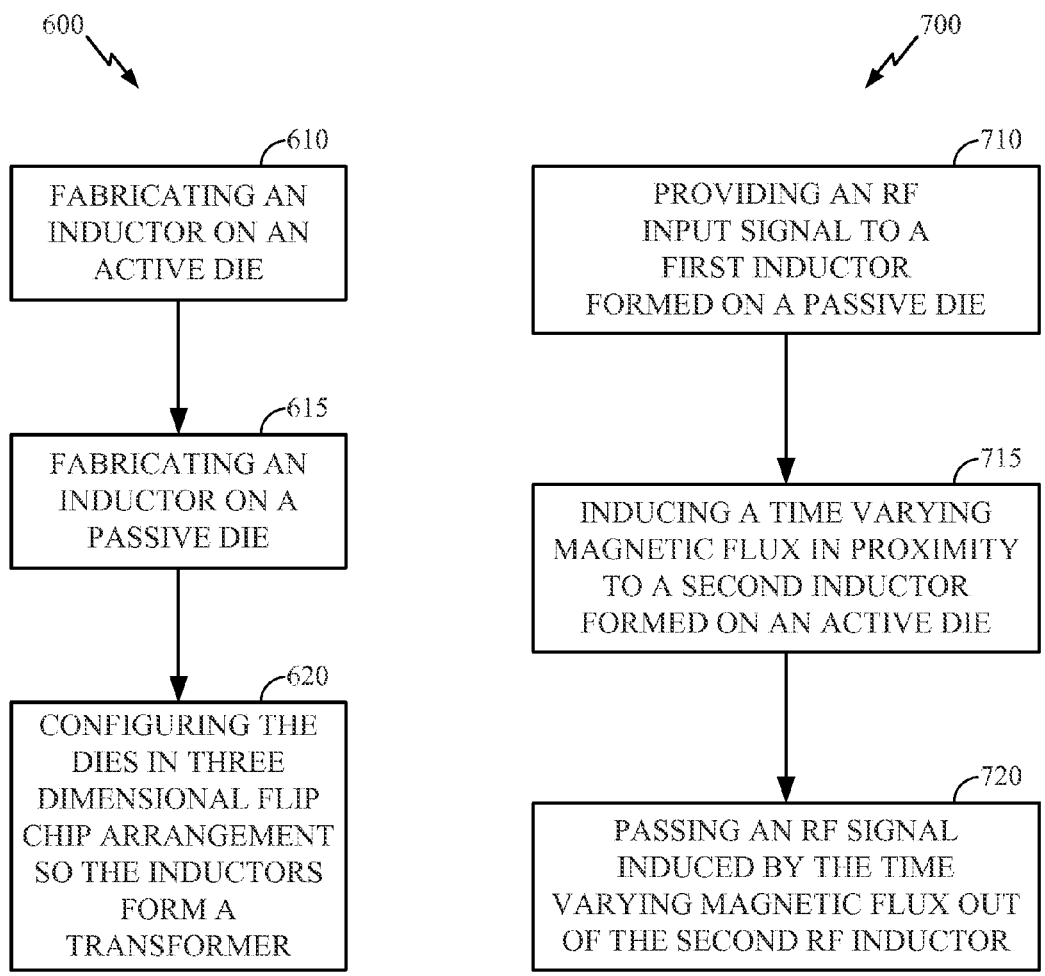
FIG. 6 is a flow chart illustrating an exemplary process for fabricating coupling using a transformer.
FIG. 7 is a flow chart illustrating an exemplary process utilizing transformer coupling.

FIG. 6 is a flow chart illustrating an exemplary process 600 for fabricating a coupling using a transformer. The process may start by fabricating an active inductor 417 on an active die 204 using fabrication techniques for applying metal materials to semiconductor substrates (Block 610). The inductors may be realized using a metalized strip which is formed in an advantageous geometry which enhances the generation of a magnetic field when an electric current passes through the metalized strip. Accordingly, the inductor may be formed using any type of metal etching techniques, such as, for example, Back End Of Line (BEOL) etching processes for on chip inductor fabrication. Other techniques such as ion implantation, chemical vapor deposition, etc. can also be used.

A passive die inductor 427 may be formed on passive die 202 using techniques similar to those described for block 610, such as, for example, BEOL metal etching processes (Block 615). Other techniques such as ion implantation, chemical vapor deposition, etc may also be used. The active die 204 and the passive die 202 may then be assembled so that the two inductors are configured to operate as a transformer (Block 620). The transformers may be axially aligned, and spaced a distance from one other to provide a desired amount of mutual inductive coupling.

As mentioned above, the inductors may be formed using a geometry that enhances the inductors ability to generate a magnetic field. While the inductors in FIG. 4 are shown having a planer helix configuration (i.e., a flat spiral coil), one would appreciate that other shapes may be used for realization. For example the inductors may be formed as a spiral square, etc. In other embodiments, the inductors may not be restricted to planar configurations, and may be formed using a three-dimensional geometry which may be placed on the substrate and/or may be etched into the depth of the substrate and/or layers formed on the substrate. The metal strip may use any conventional materials suitable for metal etching such as, for example, copper, aluminum, etc., and/or any alloys thereof.

FIG. 7 is a flow chart illustrating an exemplary process 700 for utilizing the transformer coupling. Initially, the RF input signal may be passed over wire bond connector 120 through capacitor 105. The signal may the pass through the passive die inductor 427 (Block 710). The passive die inductor 427 is energized by the input RF signal and generates a time varying magnetic flux in proximity to the active die inductor 417 (Block 715). The time varying magnetic flux energizes the active die inductor 417, thus inducing a voltage signal proportional to the RF input signal (Block 720). The induced RF signal is then provided to the subsequent active and passive components within the downstream portions of the integrated circuit.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In FIG. 4, three dimensional flip chip assembly 400 is shown. For example, in embodiments flip chip assembly may integrated into mobile phones, hand-held personal communication systems (PCS) units, portable data units such as personal data assistants, GPS enabled devices, navigation devices, set-top boxes, music players, video players, entertainment units, fixed location data units such as meter reading equipment, or any other device that having flip chip assembly according to embodiment disclosed herein, or any combination thereof. Although FIG. 4 illustrates a three dimensional flip chip assembly according to the teachings of the disclosure, the disclosure is not limited to these exemplary illustrated configurations. Embodiments of the disclosure may be suitably employed in any device which includes active integrated circuitry including a flip chip assembly.

The foregoing disclosed devices and methods may be designed and configured into GDSII and GERBER computer files, stored on a computer readable media. These files can in turn be provided to fabrication handlers who fabricate devices based on these files. The resulting products may be semiconductor wafers that are then cut into semiconductor die and packaged into a semiconductor chip. The chips may then be employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for matching impedance in an RF circuit fabricated using flip-chip techniques, comprising:
   passing an RF input signal through a first inductor formed using a passive process;
   inducing a time varying magnetic flux in proximity to a second inductor formed using an active process;
   passing an RF signal induced by the time varying magnetic flux through the second inductor; and
   physically coupling a low noise RF amplifier to the second inductor, which receives the induced RF signal, wherein the induced RF signal does not contact a mechanical connection, and wherein the first inductor and second inductor are part of an RF impedance matching circuit for the low noise RF amplifier.

2. The method of claim 1, wherein the first inductor and the second inductor are configured as a transformer and wherein the first inductor has a greater number of windings than the second inductor.

3. The method of claim 1, further comprising:
   placing a ferromagnetic material between the first inductor and the second inductor.

4. The method of claim 3, wherein the ferromagnetic material comprises a ferrite film.

5. A method for matching impedance in an RF circuit fabricated using flip-chip techniques, comprising:
   step for passing an RF input signal through a first inductor formed using a passive process;
   step for inducing a time varying magnetic flux in proximity to a second inductor formed using an active process;

step for passing an RF signal induced by the time varying magnetic flux through the second inductor; and step for physically coupling a low noise RF amplifier to the second inductor, which receives the induced RF signal, wherein the induced RF signal does not contact a mechanical connection, and wherein the first inductor and second inductor are part of an RF impedance matching circuit for the low noise RF amplifier.

6. The method of claim 5, wherein the first inductor and the second inductor are configured as a transformer and wherein the first inductor has a greater number of windings than the second inductor.

7. The method of claim 5, further comprising:

step for placing a ferromagnetic material between the first inductor and the second inductor.

8. The method of claim 7, wherein the ferromagnetic material comprises a ferrite film.

\* \* \* \* \*